(12) United States Patent
Bakeroot

(10) Patent No.: US 12,513,935 B2
(45) Date of Patent: Dec. 30, 2025

(54) III-V SEMICONDUCTOR DEVICE

(71) Applicants: IMEC VZW, Leuven (BE);
Universiteit Gent, Ghent (BE)

(72) Inventor: Benoit Bakeroot, Ghent (BE)

(73) Assignee: Imec VZW, Leuven (BE)

( * ) Notice: Subject to any disclaimer, the term of this patent is extended or adjusted under 35 U.S.C. 154(b) by 698 days.

(21) Appl. No.: 17/837,719

(22) Filed: Jun. 10, 2022

(65) Prior Publication Data
US 2022/0406926 A1 Dec. 22, 2022

(30) Foreign Application Priority Data

Jun. 16, 2021 (EP) .................................. 21179786

(51) Int. Cl.
| H10D 30/47 | (2025.01) |
| H10D 30/01 | (2025.01) |
| H10D 62/85 | (2025.01) |

(52) U.S. Cl.
CPC ......... H10D 30/475 (2025.01); H10D 30/015 (2025.01); H10D 62/8503 (2025.01)

(58) Field of Classification Search
CPC ............. H01L 29/7786; H01L 29/2003; H01L 29/66462; H10D 30/475; H10D 30/015; H10D 62/8503; H10D 30/477
See application file for complete search history.

(56) References Cited

U.S. PATENT DOCUMENTS

| 8,937,338 B2 | 1/2015 | Chowdhury et al. |
| 9,490,357 B2 | 11/2016 | Khalil et al. |
| 10,756,207 B2 | 8/2020 | Mishra et al. |
| 2013/0256681 A1* | 10/2013 | Wang .................. H10D 62/605 257/77 |
| 2015/0021660 A1* | 1/2015 | Chen .................... H10D 30/015 257/190 |
| 2015/0069405 A1* | 3/2015 | Yoshioka ........... H10D 30/0297 438/172 |

(Continued)

FOREIGN PATENT DOCUMENTS

CN 109004017 B 9/2020

OTHER PUBLICATIONS

Oka, Tohru et al. "1.8 mΩ.cm2 Vertical GaN-Based Trench Metal-Oxide-Semiconductor Field-Effect Transistors on a Free-Standing GaN Substrate for 1.2-kV-Class Operation." Applied physics express 8.5 (2015): n. pag. Web. (Year: 2015).*

(Continued)

*Primary Examiner* — Ratisha Mehta
*Assistant Examiner* — Adam Joseph Mott
(74) *Attorney, Agent, or Firm* — McDonnell Boehnen Hulbert & Berghoff LLP

(57) ABSTRACT

A III-V device and a method for forming the device is provided. The III-V FET device includes: a device layer stack including in a bottom-up direction: a drain layer of n-type GaN, a drift layer of n-type GaN, a channel layer of p-type GaN, and a source layer; a gate extending in a top-down direction into the device layer stack and through the channel layer; and a source contact in contact with the source layer and a drain contact in contact with the drain layer; wherein the source layer is formed by a heterostructure comprising in the bottom-up direction a buffer layer of unintentionally doped GaN and a barrier layer of AlGaN.

20 Claims, 5 Drawing Sheets

(56) References Cited

U.S. PATENT DOCUMENTS

| | | | | |
|---|---|---|---|---|
| 2015/0255547 | A1* | 9/2015 | Yuan | H10D 8/60 |
| | | | | 257/76 |
| 2016/0071732 | A1* | 3/2016 | Nishii | H01L 21/0228 |
| | | | | 438/795 |
| 2016/0233325 | A1* | 8/2016 | Bera | H01L 21/31133 |
| 2018/0145163 | A1* | 5/2018 | Teo | H10D 62/10 |
| 2020/0295173 | A1* | 9/2020 | Escoffier | H10D 64/513 |
| 2021/0193846 | A1* | 6/2021 | Drowley | H10D 30/62 |

OTHER PUBLICATIONS

Tohru Oka et al.2015 Appl. Phys. Express 8 054101 (Year: 2015).*
Biswas, Debaleen et al. "Epitaxial Regrowth and Characterizations of Vertical GaN Transistors on Silicon." Semiconductor science and technology 34.9 (2019): 95013-. Web. (Year: 2019).*
Mukherjee, Kalparupa et al. "Analysis of Threshold Voltage Instabilities in Semi-Vertical GaN-on-Si FETs." Applied physics express 13.2 (2020): 24004-. Web. (Year: 2020).*
Otake, Hirotaka et al. "Vertical GaN-Based Trench Gate Metal Oxide Semiconductor Field-Effect Transistors on GaN Bulk Substrates." Applied Physics Express 1.1 (2008): 11105-. Web. (Year: 2008).*
Hu, Jie et al. "Materials and Processing Issues in Vertical GaN Power Electronics." Materials Science in Semiconductor Processing 78 (2018): 75-84. Web. (Year: 2018).*
Zhang, Yuhao, Armin Dadgar, and Tomas Palacios. "Gallium Nitride Vertical Power Devices on Foreign Substrates: A Review and Outlook." Journal of Physics D: Applied Physics 51.27 (2018): 273001-. Web. (Year: 2018).*
Ramdani, Mohammed R., et al., "Effect of Carbon Doping on Crystal Quality, Electrical Isolation and Electron Trapping In GaN based Structures Grown Silicon Substrates," Solid-State Electronics (2012) vol. 75, pp. 86-92.
Ji, Dong et al., "880 V/2.7 mΩ-Cm2 MIS Gate Trench CAVET on Bulk GaN Substrates," IEEE Electron Device Letters (2018) vol. 39, No. 6, pp. 863-865.
Li, Wenshen et al., "600 V GaN Vertical V-Trench MOSFET with MBE Regrown Channel," IEEE Xplore (2017) downloaded on Apr. 30, 2021 from IEEE Xplore, pp. 1-2.
Zhou, Qi et al., "A Novel Kilovolts GaN Vertical Superjunction MOSFET with Trench Gate: Approach for Device Design and Optimization," IEEE Journal of Emerging and Selected Optics in Power Electronics (2019) vol. 7, No. 3, pp. 1440-1448.
Extended European Search Report issued in European Patent Application No. 21179786.5 dated Nov. 22, 2021.
Agarwal, Anchal, Onur Koksaldi, Chirag Gupta, Stacia Keller, and Umesh K. Mishra. "Maskless regrowth of GaN for renched devices by MOCVD." Applied Physics Letters 111, No. 23 (2017): 233507.
Biswas, Debaleen, Naoki Torii, Keiji Yamamoto, and Takashi Egawa. "Epitaxial regrowth and characterizations of vertical GaN transistors on silicon." Semiconductor Science and Technology 34, No. 9 (2019): 095013.
Guo, Zhibo, Collin Hitchcock, and Tat-Sing Paul Chow. "Comparative performance evaluation of lateral and vertical GaN high-voltage power field-effect transistors." Japanese Journal of Applied Physics 58, No. SC (2019): SCCD09.

* cited by examiner

III-V SEMICONDUCTOR DEVICE

CROSS-REFERENCE

The present application claims priority from European Patent Application No. 21179786.5, filed on Jun. 16, 2021, which is incorporated by reference in its entirety.

TECHNICAL FIELD

The present disclosure relates to a III-V field-effect transistor (FET) device and to a method for forming a III-V FET device.

BACKGROUND OF THE DISCLOSURE

III-V semiconductor devices are progressively replacing traditional silicon-based devices for power applications where a high breakdown voltage is required. Gallium nitride (GaN) is a promising material for power applications such as vertical channel semiconductor devices.

FIG. 1 schematically shows a conventional GaN-based vertical FET device 10 comprising an n-type GaN drain layer 12, an n-type GaN drift layer 14, a p-type GaN channel layer 16 and an n-type GaN source layer 18. A trench-gate 20 is arranged to extend through the channel layer 16 and allows inducing a vertical channel through the channel 16. A body contact 24 and a source contact 26 is arranged in contact with the channel layer 16 and the source layer 18, respectively. A drain contact 22 is arranged in contact with the drain layer 12 and laterally isolated from the device layer stack by an isolation region 28. Due to the lateral offset of the drain contact 22 with respect to the channel, the GaN-device 10 may be referred to as a semi-vertical GaN device 10.

The drain and source layers 12, 18 may have a high n-type doping, e.g. 3E18 $cm^{-3}$ or higher, while the drift layer 14 may have a somewhat lower doping. The channel layer 16 may e.g. have a p-type doping of 5E16 to 1E19 $cm^{-3}$. The GaN-layers are typically deposited by metal organic chemical vapor deposition (MOCVD). Both in-situ doping and doping by ion implantation may be used, although in-situ doping may be advantageous due to its comparably lower tendency to cause defect formation. In in-situ doping, impurities selected in accordance with the intended conductivity type are introduced into the MOCVD reactor during layer deposition. Silicon (Si) may be used as an n-type dopant while magnesium (Mg) may be used as a p-type dopant.

It has however been realized that the composition of the device layer stack of a (semi-)vertical GaN-device, as described above, may introduce challenges related to doping profile control. More specifically, the presence of a highly doped n-type GaN source layer may counteract out-diffusion of hydrogen (H) from the p-type GaN channel layer during fabrication. Presence of H in the channel layer may in turn inhibit activation of the p-type dopant, e.g. Mg. It may hence be challenging to precisely control a doping profile and a doping level of the channel layer. This may in turn translate to reduced performance of the final device.

SUMMARY OF THE DISCLOSURE

It is an objective of the present disclosure to provide a III-V FET device addressing the aforementioned challenges. A further objective is to provide III-V FET device with a device layer stack which facilitates control over a final doping level of the p-type GaN channel layer. Further and alternative objectives may be understood from the following.

According to a first aspect of the present disclosure there is provided a III-V FET device comprising:
a device layer stack comprising in a bottom-up direction: a drain layer of n-type GaN, a drift layer of n-type GaN, a channel layer of p-type GaN, and a source layer;
a gate extending in a top-down direction into the device layer stack and through the channel layer; and
a source contact in contact with the source layer and a drain contact in contact with the drain layer;
wherein the source layer is formed by a heterostructure comprising in the bottom-up direction a buffer layer of unintentionally doped GaN and a barrier layer of AlGaN.

The device layer stack of the III-V FET device of the present disclosure obviates the need for a highly doped n-type GaN source layer on top of the channel layer. Instead, the source layer forms/defines a heterostructure wherein the Unintentionally Doped (UID) GaN buffer layer and the AlGaN barrier layer facilitates formation of a two-dimensional electron gas (2DEG). Accordingly, charge carriers may be sourced from the 2DEG.

The AlGaN barrier layer may be arranged in direct contact with the UID GaN buffer layer. The 2DEG may thus be formed along an interface between the UID GaN buffer layer and the AlGaN barrier layer. Alternatively, the source layer heterostructure may further comprise a spacer layer of AlN arranged intermediate and in direct contact with the buffer layer and the barrier layer. The 2DEG may thus be formed along an interface between the UID GaN buffer layer and the AlN spacer layer.

In absence of a highly doped n-type GaN source layer on top of the channel layer, out-diffusion of H-traces, which may be incorporated into the channel layer (e.g. during MOCVD), may be facilitated during device fabrication. This may in turn enable a higher degree of activation of p-type dopants in the channel layer (e.g. during dopant activation anneal).

It is further contemplated that a higher degree of activation of p-type dopants in the channel layer also may enable better control over the breakdown voltage by providing an improved margin against punch-through in the channel layer.

Furthermore, since n-type counter-doping of the source layer is not needed, n-type dopant in-diffusion (e.g. Si) into the channel layer may be avoided. This may further contribute to a higher net effective p-type doping in the channel layer.

Meanwhile, the UID GaN buffer layer may accommodate for possible p-type dopant presence in the UID GaN buffer layer where the 2DEG is formed, thereby also limiting/avoiding p-type dopants presence in the AlGaN barrier layer and/or AlN spacer layer if present.

The above effects may combine synergistically to enable a device with improved doping profile control and electrical performance.

As used herein, the term "bottom-up direction" refers to the direction along which the layers of the device layer stack are stacked or formed. The "bottom-up direction" may also be understood as a normal or vertical direction with respect to a substrate supporting the device layer stack.

The term "unintentionally doped GaN", or shorter "UID GaN" refers to a GaN material without any intentionally introduced dopants. Accordingly, the "buffer layer of UID GaN" refers to a buffer layer of GaN without any intentionally introduced dopants.

The UID GaN buffer layer may however still present a p-type doping, e.g. a light p-type doping (but with decreasing density towards the interface to the barrier layer/spacer layer). It is expected that using typical state-of-the-art fabrication processes, the majority source of p-type dopants in the buffer layer may be from in-diffusion of p-type dopants (e.g. Mg) from the channel layer, or from trace amounts of p-type dopants remaining in the growth reactor after forming the preceding channel layer.

According to embodiments, the buffer layer may have a p-type doping of $5E15$ cm$^{-3}$ or less, at least in an upper portion thereof. A p-type doping of $5E15$ cm$^{-3}$ or less may enable a comparably high 2DEG sheet conductivity in the source layer, more specifically at the interface towards the barrier layer/spacer layer. The upper portion may be formed by (at least) a top-most 5 nm thickness portion of the buffer layer. In other words, the buffer layer may have a p-type doping of $5E15$ cm$^{-3}$ or less in the top-most 5 nm thickness portion (at least) of the buffer layer. Advantageously, the buffer layer may have a p-type doping of $5E15$ cm$^{-3}$ or less in the top-most 10 nm thickness portion (at least) of the buffer layer. Even lower p-type doping levels, such as $1E15$ cm$^{-3}$ or less, may enable an even higher 2DEG sheet conductivity.

According to embodiments, the buffer layer may have a thickness in a range from 50 nm to 250 nm. A thickness in this range may accommodate for levels of p-type out-diffusion which can be expected from a channel layer with a sufficient p-type doping, without exceeding a p-type doping of $5E15$ cm$^{-3}$ in the upper portion (e.g. 5-10 nm thickness) of the buffer layer.

According to embodiments, the barrier layer may have a thickness of at least 15 nm. An AlGaN barrier layer of such a thickness may enable a comparably high 2DEG sheet conductivity in the source layer.

According to embodiments, an aluminum content of the barrier layer may be in a range from 15% to 40%. An aluminum content in this range may strike a balance between a high 2DEG carrier concentration and limiting lattice-mismatch induced stress in the layer stack. A more conservative range may be 30% to 35%, According to embodiments, the heterostructure further comprises a spacer layer of AlN arranged on the buffer layer, wherein the barrier layer is arranged on the spacer layer. Providing a spacer layer of AlN intermediate the barrier layer and the buffer layer may serve to increase a band gap difference with respect to the buffer layer. This may enable an increased 2DEG sheet conductivity.

According to embodiments, the spacer layer (121) may have a thickness of 3 nm or less, e.g. in a range from 0.5 nm to 2 nm. Lattice-induced stress due to the spacer layer may thereby be limited.

According to embodiments, the device layer stack may further comprise a capping layer of GaN arranged on the barrier layer. The capping layer may mitigate issues with surface morphology of the layer stack. The capping layer may be formed with a thickness in a range from 1 nm to 3 nm.

According to embodiments, the channel layer may have a p-type doping in a range from $5E16$ cm$^{-3}$ to $1E19$ cm$^{-3}$.

According to embodiments, the channel layer may have a thickness in a range from 300 nm to 800 nm.

According to embodiments the device further comprises a body contact contacting an upper channel layer portion. The upper channel layer portion may have a greater p-type doping than a lower portion of the channel layer. Hence, a highly doped body contact portion may be provided, which may be accessed from above by the body contact.

According to a second aspect of the present disclosure, there is provided a method for forming a III-V field-effect transistor device, the method comprising:

forming a device layer stack by sequentially forming (i.e. forming in sequence): a drain layer of n-type GaN, a drift layer of n-type GaN, a channel layer of p-type GaN, and a source layer;

forming a gate extending in a top-down direction into the device layer stack and through the channel layer;

forming a source contact in contact with the source layer; and forming a drain contact in contact with the drain layer;

wherein forming the source layer comprises forming a heterostructure by sequentially forming a buffer layer of unintentionally doped GaN and a barrier layer of AlGaN.

All advantages, embodiments, features and subject-matter discussed with reference to the device according to the first aspect may apply also to (and/or be combinable with) the method according to the second aspect, and vice versa. For example, the discussion of doping levels and layer thicknesses of the layers of the device layer stack apply correspondingly to the layers of the device layer stack formed by the method.

According to embodiments, each one of the drain layer, the drift layer, the channel layer, the buffer layer and the barrier layer may be epitaxially grown, wherein at least the channel layer is doped in-situ during epitaxy, and wherein the buffer layer is formed without introducing dopants during epitaxy (i.e. into a growth reactor in which the epitaxy occurs). Accordingly, the layers of the layer stack may be epitaxial layers. In-situ doping may avoid the risk of defect formation typically associated with doping by ion implantation, which may be advantageous especially for the channel layer. However, in-situ doping may for corresponding reasons be used also for the drain layer and the drift layer.

According to embodiments, the buffer layer may be formed with a p-type doping of $5E15$ cm$^{-3}$ or less, at least in an upper portion thereof.

According to embodiments, the method may comprise epitaxially growing the buffer layer to a thickness in a range from 50 nm to 250 nm. The buffer layer may thereby be epitaxially grown to obtain a p-type doping of $5E15$ cm$^{-3}$ or less (or $1E15$ cm$^{-3}$ or less) in a top-most thickness portion thereof (e.g. in at least the top-most 5-10 nm of the buffer layer).

According to embodiments, the method may further comprise forming a body contact contacting an upper channel layer portion. The channel layer may be formed with an upper channel layer portion having a greater p-type doping than a lower channel layer portion, wherein a highly doped body contact portion may be provided. In case of doping the channel layer in-situ during epitaxy, a dopant concentration may be increased during the epitaxy of the upper channel layer portion, compared to a dopant concentration during the epitaxy of the lower channel layer portion.

BRIEF DESCRIPTION OF THE DRAWINGS

The above, as well as additional objects, features and advantages, may be better understood through the following illustrative and non-limiting detailed description, with reference to the appended drawings. In the drawings like reference numerals will be used for like elements unless stated otherwise.

DETAILED DESCRIPTION OF THE DISCLOSURE

Figure 2:
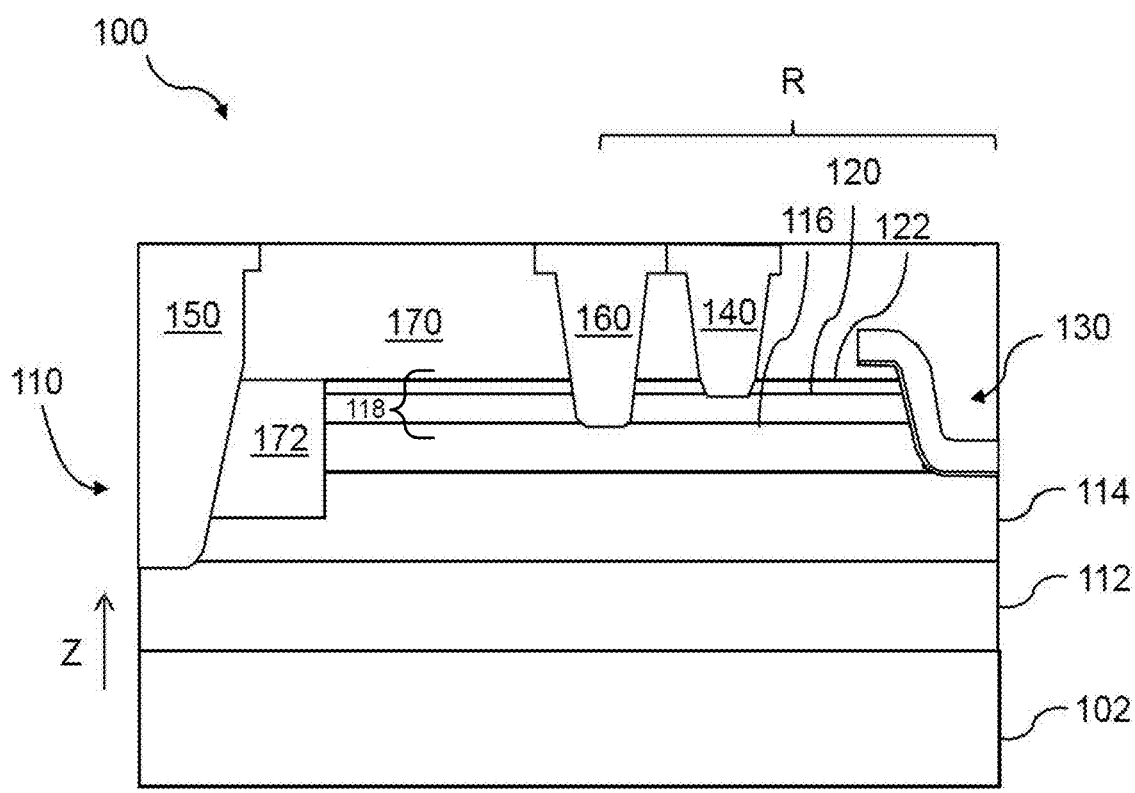
FIG. 2 schematically shows a cross-section of a III-V FET device 100 according to a representative embodiment.
Figure 3:
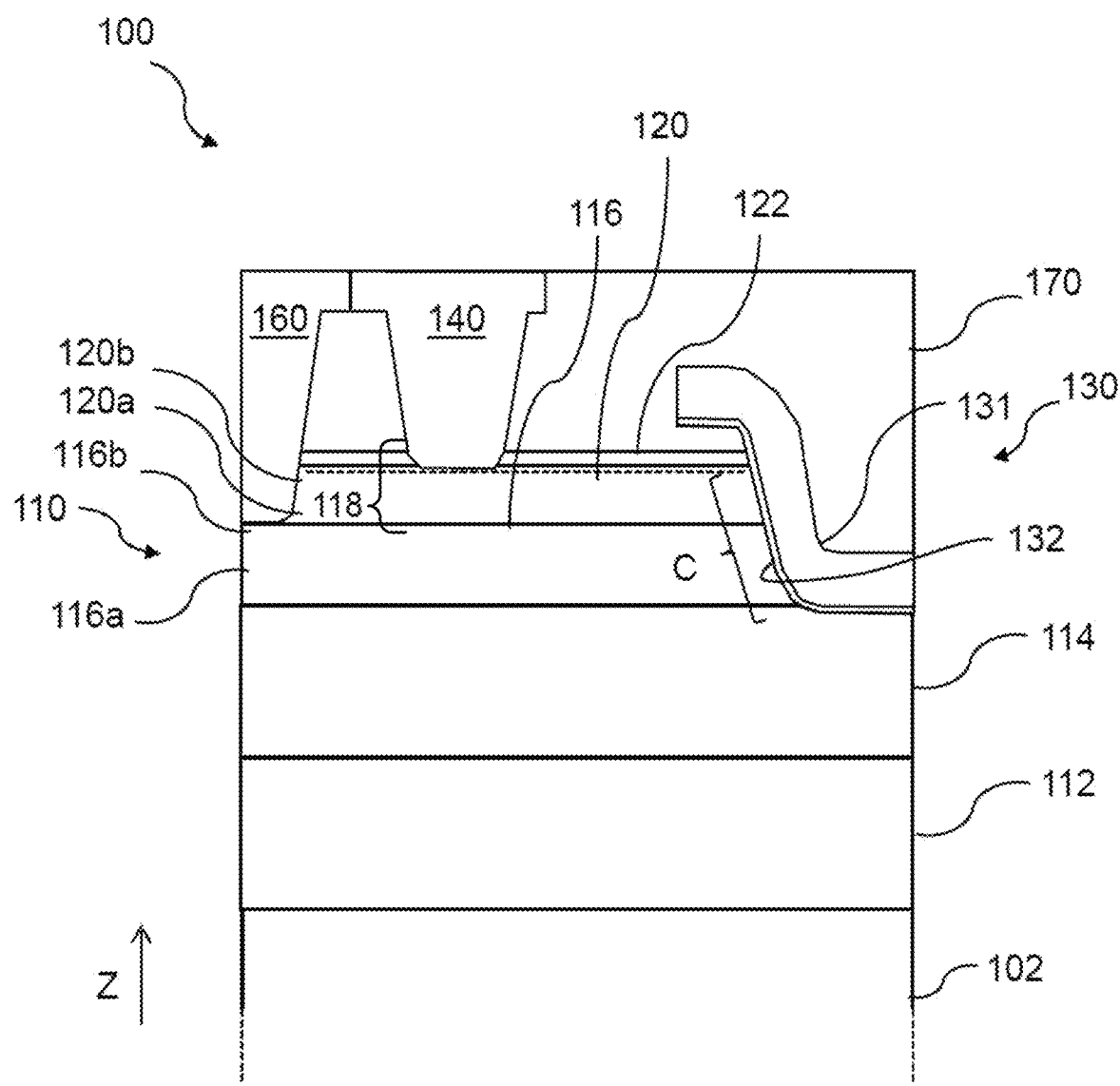
FIG. 3 is an enlarged view of a region R of the device 100 of FIG. 2.

With reference to FIG. 2 there is shown, in cross-section, an embodiment of a III-V FET device 100. FIG. 3 shows an enlarged view of a region R of the device 100. It is to be noted that, owing to the schematic nature of the drawings, the relative dimensions of the shown elements, in particular the relative thickness of the layers, are not drawn to scale. Rather the dimensions have been adapted for illustrational clarity and to facilitate understanding of the following description.

The device 100 comprises a substrate 102. The substrate may be a semiconductor substrate, such as a Si substrate. As one example, the substrate may be a Si substrate having a <111> upper surface. However the substrate 102 may more generally be of any type suitable to support III-V epitaxy, in particular GaN-based layers, e.g (Al)GaN-based substrates.

The device 100 comprises a device layer stack 110. The device layer stack 110 is arranged on the substrate 102. The device layer stack 110 comprises, in a bottom-up direction (indicated Z in FIG. 2), as viewed from the substrate 102, a drain layer 112 of n-type GaN, a drift layer 114 of n-type GaN, a channel layer 116 of p-type GaN, and a source layer 118. As may be more readily seen in the enlarged view of FIG. 3, the source layer 118 comprises a heterostructure of a buffer layer 120 of UID GaN and a barrier layer 122 of AlGaN arranged on top of, in direct contact with, the buffer layer 120.

Each one of the layers 112, 114, 116, 120, 122 of the layer stack 110 may be formed as a respective epitaxial layer. That is, each layer may be epitaxially grown. Each layer may be formed by metal organic chemical vapor deposition (MOCVD).

Doping of the layers (e.g. 112, 114, 116) may achieved by in-situ doping, i.e. by introducing suitable dopants of p- or n-type in the MOCVD growth reactor during the epitaxial growth. Doping by ion implantation is also possible, however, in-situ doping may enable less defects and improved control over the doping profile throughout the device layer stack 110.

The drain layer 112 may be formed with a thickness ranging from 250 nm to 800 nm. The drain layer 112 may have an n-type doping concentration from 3E18 to 5E20 cm$^{-3}$ (e.g. n$^+$ or n$^+$ GaN).

The drift layer 114 may be formed with a thickness ranging from 600 nm to 10 µm. The drift layer 114 may have an n-type doping concentration ranging from 1E14 to 1E17 cm$^{-3}$ (e.g. n or n$^-$ GaN).

The channel layer 116 may be formed with a thickness ranging from 300 nm to 800 nm. The channel layer 116 may have a p-type doping concentration ranging from 5E16 cm$^{-3}$ to 1E19 cm$^{-3}$ (e.g. p or p$^+$ GaN). To facilitate a low-resistance body connection, the channel layer 116 may be modulation-doped such that an upper channel layer portion 116b of the channel layer 116 may be formed with a higher p-type doping than a lower channel layer portion 116a. E.g. the upper portion 116b may have a p$^+$ doping and the lower portion 116a may have a p doping. A thickness of the upper portion 116b may correspond to e.g. 1-10% of a total thickness of the channel layer 116.

The buffer layer 120 may be formed with a thickness ranging from 50 nm to 250 nm. The thickness of the buffer layer 120 may hereby be measured from the level in the device layer stack 110 at which the p-type doping starts to decrease (i.e. along the bottom-up direction, Z). In relation to an epitaxial growth process, this level may correspond to the level at which GaN growth without any intentional doping is initiated (i.e. UID GaN growth), in particular where an in-flux of dopants for in situ doping of the channel layer 116 into the growth reactor is stopped. The buffer layer 120 may accordingly present p-type doping concentration which decreases along the bottom-up direction (Z), to a p-type doping concentration of 5E15 cm$^{-3}$ or less, or even 1E15 cm$^{-3}$ or less.

It is contemplated that the precise doping profile of the UID GaN layer, and the level at which the desired p-type doping (e.g. 5E15 cm$^{-3}$ or less) is reached, may depend on the actual composition of the layer stack and the precise process conditions during fabrication. By way of example, a higher p-type doping of the p-type GaN channel layer may cause a higher in-diffusion of p-type dopants into the buffer layer 120, and/or greater trace amounts of p-type dopants during the deposition of the buffer layer 120. Conversely, a greater thickness of the UID GaN layer may reduce a concentration of p-type dopants in the upper thickness portion thereof. At the limit, the p-type doping of the upper thickness portion of the UID GaN layer may even approach that of undoped/intrinsic GaN.

The buffer layer 120 may accordingly as indicated in FIG. 3 comprise a lower transition portion 120a (below the upper thickness portion 120b) presenting a p-type doping decreasing from a higher/initial p-type doping level (e.g. corresponding to the p-type doping level of the top-most thickness portion of the channel layer 116) to a lower/desired p-type doping level (e.g. of 5E15 cm$^{-3}$ or less). For the above-discussed doping levels of the channel layer 116, a thickness of the lower transition portion 120a may range from 20 nm to 45 nm. A thickness of the upper/top-most thickness portion 120b (e.g. with a p-type doping of 5E15 cm$^{-3}$ or less, or 1E15 cm$^{-3}$ or less) may be at least 5 nm, or at least 10 nm.

The barrier layer 122 may be formed with a thickness of 15 nm or greater. The barrier layer 122 may be formed with an Al content ranging from 15% to 40%, or 30% to 35%. The AlGaN barrier layer 122 may be formed as an un-doped layer such that a lower portion of the barrier layer 122 at the interface towards the UID GaN buffer layer 120 may be undoped (e.g. 1E15 cm$^{-3}$ or less). To be precise, like the buffer layer 120, minute amounts of p-type dopant in-diffusion may occur also into the barrier layer 122. However, due the buffer layer 120 underneath these amounts will in practice be negligible such that the barrier layer 122 (at least the lower portion thereof) may be considered undoped. The AlGaN barrier layer 122 may accordingly, like the buffer layer 120, be referred to as an UID layer, e.g. an UID AlGaN barrier layer 122.

Figure 1:
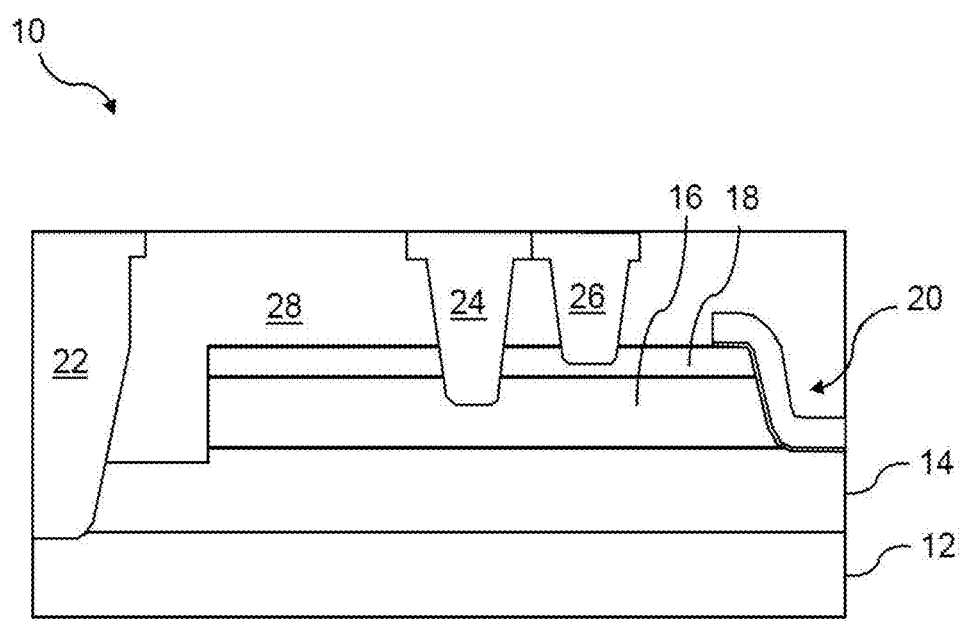
FIG. 1 schematically shows a conventional GaN-based vertical FET device 10 comprising an n-type GaN drain layer 12, an n-type GaN drift layer 14, a p-type GaN channel layer 16 and an n-type GaN source layer 18.

As may be appreciated, the carrier concentration in a doped layer (in particular an intentionally doped layer) of the device 100 may differ from the concentration of dopants incorporated into the layer during fabrication. This may be due to inhibition (e.g. caused by H in the layer), or in-diffusion or out-diffusion of dopants. This may apply in particular to the p-type channel layer 16 below the highly doped n-type GaN source layer 18 of the prior art device 10 depicted in FIG. 1. As may be understood from the present disclosure, this issue may however be mitigated in the device 100 due to the provision of a 2DEG in the heterostructure of the UID GaN buffer layer 120 and the AlGaN barrier layer 122, which may act as n-type source.

Although omitted in FIG. 2 for illustrational clarity, the device 100 may further comprise a buffer layer structure arranged between the substrate 102 and the device layer stack 110 to provide stress relief. Compositions and fabrication techniques for buffer layer structures suitable for III-V layer stacks are per se known in the art and thus not further discussed herein.

The device 100 further comprises a gate 130, a source contact 140, a drain contact 150, and a body contact 160. The source, drain and body contacts 140, 150, 160 may each be formed by conventional contact materials, such as Ti, Al, or combinations thereof. In the figures, the contacts and the gate are depicted with tapered shapes. The depicted shapes are however merely illustrative and other shapes are also possible, such as contacts and gates with vertically oriented/perpendicular sidewalls.

The source contact 140 is arranged in contact with the source layer 118, more specifically with the buffer layer 120. To ensure contact with the 2DEG in the buffer layer 120, the source contact 140 may extend into (e.g. top-down, along negative Z) the buffer layer 120, e.g. by 5 nm to 10 nm.

The body contact 160 is arranged in contact with the channel layer 116, more specifically the upper portion 116b (e.g. with a p+ doping) of the channel layer 116. The body contact 160 extends in a top-down direction (negative Z) through the layer stack 110 and terminates on or in the channel layer 116. An insulating layer may be provided on sidewalls of the body contact 160 to provide lateral isolation, e.g. from the source layer 118. Any suitable conventional dielectric may be used, e.g. a low-k oxide or nitride which may be deposited by atomic layer deposition (ALD).

In the illustrated embodiment the body contact 160 is shorted to the source contact 140, thus in effect allowing a three-terminal operation of the device 100. However, the electrical configuration may be varied and it is also possible to arrange source and body contacts 140, 160 as independently controllable device terminals.

The drain contact 150 is arranged in contact with the drain layer 112. The drain contact 150 extends in a top-down direction (negative Z) through the layer stack 110 and terminates in the drain contact layer 112. The drain contact 150 may be arranged in a drain contact trench formed to extend the layer stack 110 in the top-down direction to, optionally partly into, the drain contact layer 112.

Reference sign 172 designates an isolation region 172 of the device 100, providing lateral isolation between the drain contact 150 and the layer stack 110. The isolation region 172 may comprise one or more conventional low-k dielectric materials, such as oxides and/or nitrides, e.g. deposited in a trench formed adjacent a location of the drain contact 150. The isolation region 172 may alternatively be formed using an area-selective ion implantation process (e.g. implanting N, Ar, or He) to provide an insulating implanted region of damaged crystallographic structure of the layer stack 110.

Lateral isolation of the drain contact 150 may additionally or alternatively be provided by an insulating layer (e.g. ALD low-k oxide or nitride) arranged on sidewalls of the drain contact 150.

The drain contact 150 may be arranged in a peripheral region or edge region of the substrate 102. The edge region may comprise an outer isolation region, laterally separating the device layer stack 110 from a saw lane.

The gate 130 extends in a top-down direction into the device layer stack 110 and through the channel layer 116. The gate 130 comprises a gate electrode 131 and a gate dielectric 132. The gate electrode 131 may be formed by conventional gate electrode materials, for instance Ti or TiAl, or as a stack of layers, for instance a stack comprising TiN, Ti, and Al. The gate electrode 131 may also comprise a conductive fill material such as W. The gate dielectric 132 may be deposited on sidewalls of the trench prior to depositing the gate material. The gate dielectric 132 may be of a conventional type, such as $Al_2O_3$, $SiO_2$, or $Si_3N_4$, or combinations thereof. The gate 130 may be arranged in a trench formed to extend in a top-down direction (negative Z) into the device layer stack 110 and through the channel layer 116. The gate 130 may accordingly be a trench-gate.

An insulating layer 170 covers the device layer stack 110 and embeds the gate 130 and the source, drain and body contacts 140, 150, 160. The insulating layer 170 may for instance be formed by a conventional ILD material, such as oxide and/or nitride layers. The gate 130 and contacts 140, 150, 160 may be interconnected with surrounding circuitry in a conventional manner, e.g. by means of vias and wiring of one or more levels of a back-end-of-line interconnect structure.

As per se is known in the art, a GaN/AlGaN heterostructure allows a 2DEG to be confined at the GaN/AlGaN interface, more specifically at a side of the buffer layer 120. The 2DEG may e.g. be formed in the top-most 2 nm to 10 nm of the buffer layer 120. The 2DEG may be attributed to the polarization charges at the GaN/AlGaN interface. In FIG. 3, a 2DEG (of electrons) of the heterostructure of the source layer 118 is indicated by a dashed line. The 2DEG extends along the interface between the buffer layer 120 and the barrier layer 122.

The gate 130 is configured to induce a channel region C along its sidewall in response to a (sufficient positive) gate voltage. The channel region C extends between the source layer 118 (more specifically the 2DEG/the interface between the buffer layer 120 and the barrier layer 122) and the drift layer 114. Accordingly, charge carriers may be sourced from the 2DEG of the source layer 118. The 2DEG may hence function as a virtual n-type source layer, e.g. providing a function similar to the n-type source layer 18 of the conventional device 10 of FIG. 1. A current of charge carriers may thus flow from the source contact 140/source layer 118 to the drain contact 150/drain layer 112.

Owing to the vertical extension of the channel region C with respect to the channel layer 116/layer stack 110, the device 100 qualifies as a vertical FET device 100. Due to the laterally offset position of the drain contact 150 with respect to the channel region C, the device 100 may more specifically be referred to as a semi-vertical device, since a part of the current path will extend in-plane of the drain layer 112. However, the device layer stack 110 is compatible also with a strictly vertical device, wherein a drain contact instead may be aligned with the gate and contact the drain layer from a backside. In this configuration, the isolation region 172 is not needed.

FIGS. 2 and 3 shows a single gate 130 and source/body contact 140/160. It is however to be understood that the device 100 may be provided with a plurality of gates and source/body contacts to define a plurality of parallel FETs sharing a same drain layer 112 and drain contact 150.

Figure 4:
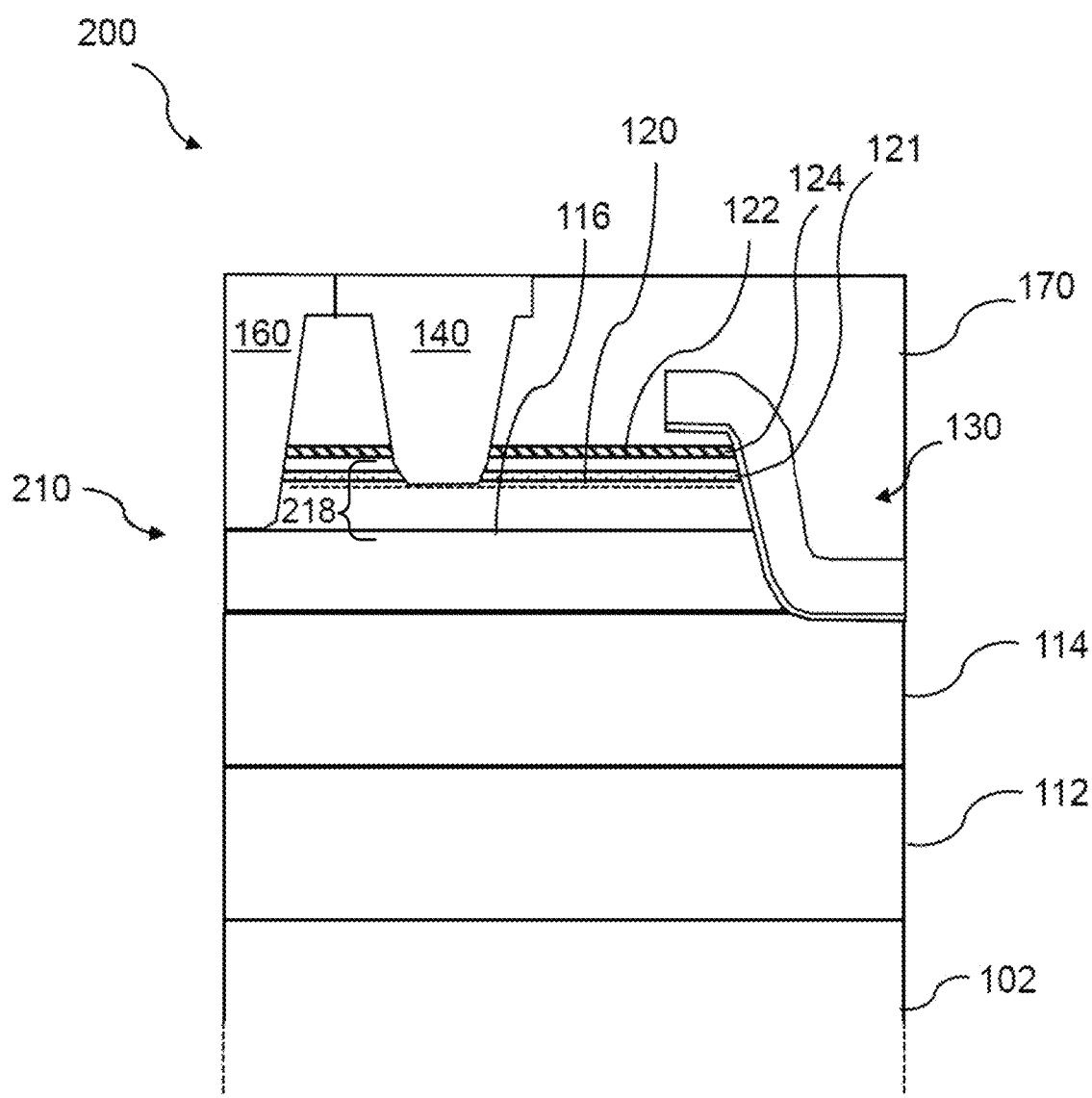
FIG. 4 schematically shows a III-V FET device 200 according to a further representative embodiment.

FIG. 4 shows a further embodiment of a III-V FET device 200. The device 200 corresponds to the device 100 and FIG. 4 depicts a region corresponding to region R depicted in FIG. 3.

The device 200 differs from the device 100 by the composition of its device layer stack 210 (corresponding to device layer stack 110). More specifically, the device layer stack 210 comprises a source layer 218 (corresponding to source layer 118) comprising a spacer layer 121 of AlN arranged on the UID GaN buffer layer 120, wherein the AlGaN barrier layer 122 is arranged on the spacer layer 121. The spacer layer 121 is in other words arranged intermediate the buffer layer 120 and the barrier layer 122. The AlN of the spacer layer 121, compared to the AlGaN, enables a higher 2DEG sheet conductivity. The spacer layer 121 may be formed as an undoped layer (or UID AlN layer, in line with the above discussion concerning doping of the AlGaN barrier layer 122). The spacer layer 121 may be formed with a thickness ranging from 0.5 nm to 3 nm, e.g. 2 nm. To ensure contact with the 2DEG in the buffer layer 120, the source contact 140 may like discussed for the device 100 extend into (e.g. top-down, along negative Z) the buffer layer 120. The source contact 140 may thus extend through the barrier layer 122 and the spacer layer 121.

The device layer stack 210 further comprises a capping layer 124 of GaN arranged on the barrier layer 122. The capping layer 124 may form a top-most layer of the device layer stack 210. The capping layer may be formed with a thickness of e.g. 5 nm.

The spacer layer 121 and the capping layer 124 may each, like the other layers of the layer stack 210, be epitaxially grown, e.g. by MOCVD.

Although the device layer stack 210 comprises both a spacer layer 121 and a capping layer 124, embodiments comprising one or the other of the layers 121, 124 are also envisaged.

Figure 5:
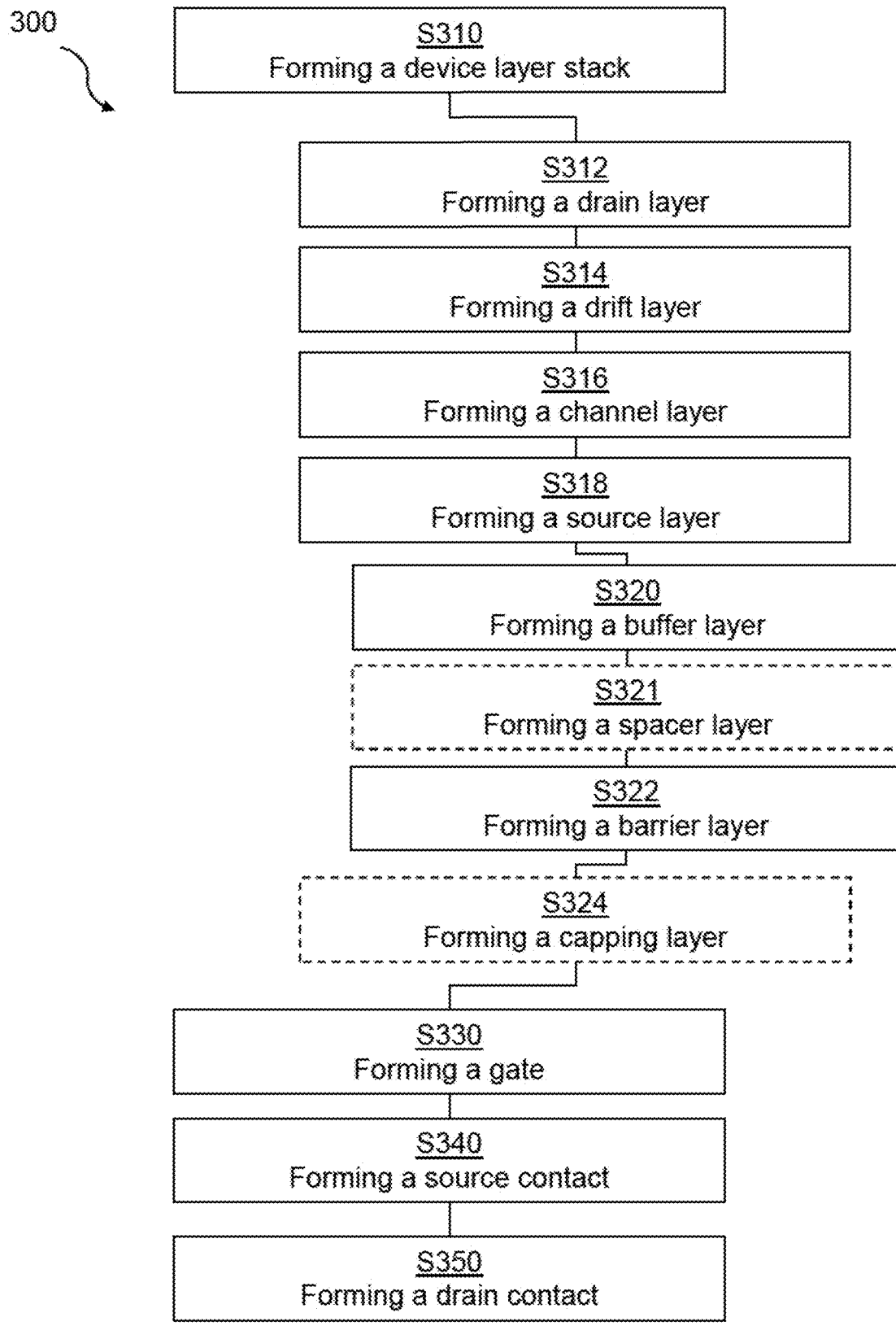
FIG. 5 is a flow chart of a method 300 for forming a III-V FET device, according to a representative embodiment.

Embodiments of a method 300 for forming a III-V FET device, such as device 100 or 200, will now be disclosed with reference to FIG. 5.

The method 300 comprises a step S310 of forming a device layer stack, (e.g. device layer stack 110 or 210). Step S310 comprises the following sequence of (sub-)steps:
  Step S312: forming a drain layer (e.g. drain layer 112);
  Step S314: forming a drift layer (e.g. drift layer 114);
  Step S316: forming a channel layer (e.g. channel layer 116);
  Step S318: forming a source layer (e.g. source layer 118 or 218). Step S318 comprises the following sequence of (sub-)steps:
  Step S320: forming a buffer layer (e.g. buffer layer 120);
  Step S321: optionally forming a spacer layer (e.g. spacer layer 121);
  Step S322: forming a barrier layer (e.g. barrier layer 122);
  After step S318, an optional (sub-)step S324 of forming a capping layer (e.g. capping layer 124) may be performed.

After step S310 of forming the device layer stack, the method 300 further comprises:
  Step S330: forming a gate extending in a top-down direction into the device layer stack and through the channel layer (e.g. gate 130);
  Step S340: forming a source contact in contact with the source layer (e.g. source contact 140)
  Step S350: forming a drain contact in contact with the drain layer (e.g. drain contact 150).

As discussed in connection with the device 100, each one of the layers of the device layer stack may be epitaxially grown, e.g. using MOCVD. The layers may be doped as appropriate, e.g. using in-situ doping.

The channel layer may be modulation doped (in-situ) to form an upper portion as a body contact portion with a higher doping than a lower portion of the channel layer. This may be achieved by increasing the amount of dopants introduced during the epitaxy when growing the upper portion of the channel layer.

The buffer layer may be formed without any intentional in-situ doping, i.e. without introducing any dopants during the epitaxy thereof, such that the buffer layer. As discussed above, in-diffusion of dopants (e.g. Mg) from the channel layer, and/or incorporation of trace amounts of dopants remaining in the growth reactor, may however occur during the epitaxy, thereby causing an unintentional doping of the buffer layer. The epitaxial growth (e.g. MOCVD) of the buffer layer may be continued until obtaining a top-most thickness portion of UID GaN (e.g. at least 5 nm thick) having a p-type doping of $5E15$ cm$^{-3}$ or less (or $1E15$ cm$^{-3}$ or less).

Also the spacer layer (if formed), and the barrier layer may be formed without any in-situ doping, i.e. without introducing any dopants during the epitaxy thereof, such that the spacer layer and the barrier layer are deposited as respective undoped/UID layers.

A dopant activation anneal step may be performed after depositing the device layer stack. It is however also possible to perform a separate dopant activation anneal step after each individual layer deposition step.

Step S330 of forming the gate may comprise etching a trench in the device layer stack extending completely through the channel layer, e.g. stopping on or in the drift layer. A gate dielectric may be deposited on sidewalls in the trench (e.g. using ALD) and gate electrode material may subsequently be deposited.

Step S340 of forming the source contact may comprise etching a trench extending into the buffer layer and depositing contact metal therein.

Step S350 of forming the drain contact may comprise etching a trench extending through the device layer stack, stopping on or in the drain layer, and depositing contact metal therein.

The method may further comprise forming a body contact (e.g. body contact 160) in contact with the body contact portion of the channel layer, in a similar manner as the source contact.

The contact metal of the source contact, the drain contact and the body contact may be deposited in a same step. Contact metal patterning steps may be applied to the deposited contact metal to define shapes with desired extensions using techniques which per se are well known in the art.

In the case of a semi-vertical device, the method may further comprise forming an isolation region (e.g. isolation region 172) adjacent the drain contact, e.g. prior to forming the drain contact.

The present disclosure has mainly been described with reference to a limited number of examples. However, as is readily appreciated by a person skilled in the art, other examples than the ones disclosed above are equally possible within the scope of the present disclosure, as defined by the appended claims.

The invention claimed is:

1. A III-V field-effect transistor device comprising:
  a device layer stack comprising in a bottom-up direction:
    a drain layer of n-type GaN, a drift layer of n-type GaN, a channel layer of p-type GaN, and a source layer;

a gate extending in a top-down direction into the device layer stack and through the channel layer;

a source contact in contact with the source layer and a drain contact extending in a top-down direction through the device layer stack in contact with the drain layer; and an isolation region providing lateral isolation between the drain contact and the drift layer, the channel layer, and the source layer, wherein the source layer is formed by a heterostructure comprising in the bottom-up direction a buffer layer of unintentionally doped GaN and a barrier layer of AlGaN, and wherein the buffer layer comprises:
- a lower transition portion with a p-type doping decreasing from a higher first p-type doping level to a lower second p-type doping level in a bottom-up direction; and
- an upper thickness portion with p-type doping at the second p-type doping level.

2. The device according to claim 1, wherein the second p-type doping level is 5E15 cm$^{-3}$ or less.

3. The device according to claim 1, wherein the buffer layer has a thickness ranging from 50 nm to 250 nm, and wherein the upper thickness portion has a thickness of at least 5 nm, and wherein the lower transition portion has a thickness of 20 nm to 45 nm.

4. The device according to claim 1, wherein the barrier layer has a thickness of at least 15 nm.

5. The device according to claim 1, wherein an aluminum content of the barrier layer ranges from 15% to 40%.

6. The device according to claim 1, wherein the heterostructure further comprises a spacer layer of AlN arranged on the buffer layer, wherein the barrier layer is arranged on the spacer layer.

7. The device according to claim 6, wherein the spacer layer has a thickness of 3 nm or less.

8. The device according to claim 1, wherein the device layer stack further comprises a capping layer of GaN arranged on the barrier layer.

9. The device according to claim 1, wherein the channel layer has a p-type doping ranging from 5E16 cm$^{-3}$ to 1E19 cm$^{-3}$.

10. The device according to claim 1, wherein the channel layer has a thickness ranging from 300 nm to 800 nm.

11. The device according to claim 1, wherein the device further comprises a body contact contacting an upper channel layer portion.

12. The device according to claim 1, wherein the isolation region comprises at least one of:
- one or more low-k dielectric materials; or
- an insulating ion implanted region.

13. A method for forming a III-V field-effect transistor device, the method comprising:

forming a device layer stack by sequentially forming: a drain layer of n-type GaN, a drift layer of n-type GaN, a channel layer of p-type GaN, and a source layer;

forming a gate extending in a top-down direction into the device layer stack and through the channel layer;

forming a source contact in contact with the source layer;

forming a drain contact in contact with the drain layer; and forming an isolation region, wherein at least a portion of the isolation region is between the drain contact and the drift layer, the channel layer, and the source layer, wherein forming the source layer comprises forming a heterostructure by sequentially forming a buffer layer of unintentionally doped GaN and a barrier layer of AlGaN, and wherein forming the buffer layer comprises:
- forming a lower transition portion with a p-type doping decreasing from a higher first p-type doping level to a lower second p-type doping level in a bottom-up direction; and
- forming an upper thickness portion with p-type doping at the second p-type doping level.

14. The method according to claim 13 wherein the second p-type doping level is 5E15 cm$^{-3}$ or less.

15. The method according to claim 13, wherein the method comprises epitaxially growing the buffer layer to a thickness ranging from 50 nm to 250 nm, and wherein the upper thickness portion has a thickness of at least 5 nm, and wherein the lower transition portion has a thickness of 20 nm to 45 nm.

16. The method according to claim 13, wherein each one of the drain layer, the drift layer, the channel layer, the buffer layer and the barrier layer are epitaxially grown, wherein at least the channel layer is doped in-situ during epitaxy thereof, and wherein the buffer layer is formed without introducing dopants during epitaxy thereof.

17. The method according to claim 16, wherein the second p-type doping level is 5E15 cm$^{-3}$ or less.

18. The method according to claim 16, wherein the method comprises epitaxially growing the buffer layer to a thickness ranging from 50 nm to 250 nm, and wherein the upper thickness portion has a thickness of at least 5 nm, and wherein the lower transition portion has a thickness of 20 nm to 45 nm.

19. The method according to claim 13, wherein forming the isolation region further comprises at least one of:
- depositing one or more low-k dielectric materials in a trench formed adjacent to the drain contact; or
- forming the isolation region by area-selective ion implanting.

20. The method according to claim 19, wherein forming the isolation region by selective area ion-implanting further comprises using N, He, or Ar ions.

* * * * *